(12) United States Patent
Metz et al.

(10) Patent No.: US 7,875,937 B2
(45) Date of Patent: Jan. 25, 2011

(54) SEMICONDUCTOR DEVICE WITH A HIGH-K GATE DIELECTRIC AND A METAL GATE ELECTRODE

(75) Inventors: Matthew V. Metz, Hillsboro, OR (US); Suman Datta, Beaverton, OR (US); Mark L. Doczy, Beaverton, OR (US); Justin K. Brask, Portland, OR (US); Jack Kavalieros, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/287,308

(22) Filed: Oct. 7, 2008

(65) Prior Publication Data

US 2009/0039446 A1    Feb. 12, 2009

Related U.S. Application Data

(62) Division of application No. 11/151,528, filed on Jun. 13, 2005, now Pat. No. 7,449,756.

(51) Int. Cl.
*H01L 21/02*    (2006.01)
(52) U.S. Cl. .................. 257/406; 257/410; 257/411
(58) Field of Classification Search ............... 257/410, 257/411, 406
See application file for complete search history.

(56) References Cited

U.S. PATENT DOCUMENTS

| 2002/0008289 A1* | 1/2002 | Murota et al. ............... 257/369 |
| 2006/0113605 A1* | 6/2006 | Currie ......................... 257/368 |
| 2006/0220090 A1* | 10/2006 | Metz et al. .................. 257/310 |
| 2006/0247131 A1* | 11/2006 | Horibe et al. ............... 505/100 |

* cited by examiner

*Primary Examiner*—Phat X Cao
(74) *Attorney, Agent, or Firm*—Kenneth A. Nelson

(57) ABSTRACT

A semiconductor device is described. That semiconductor device comprises a high-k gate dielectric layer that is formed on a substrate that applies strain to the high-k gate dielectric layer, and a metal gate electrode that is formed on the high-k gate dielectric layer.

12 Claims, 1 Drawing Sheet

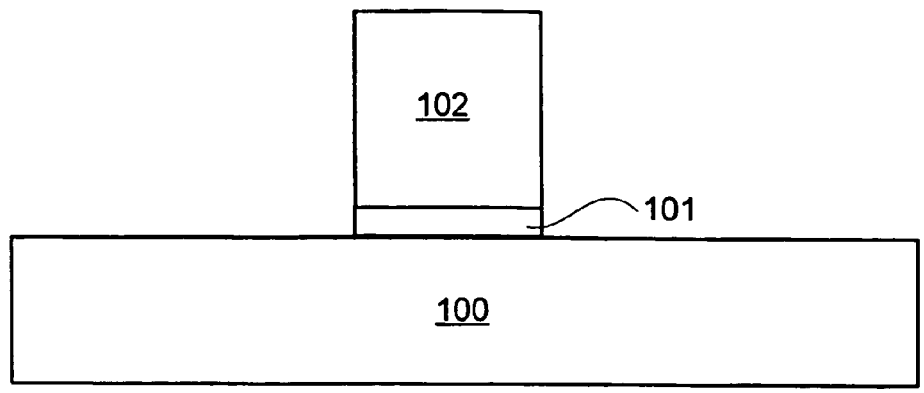
Fig. 1
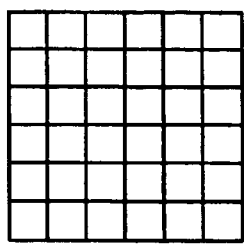 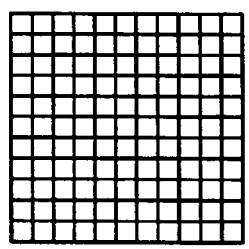 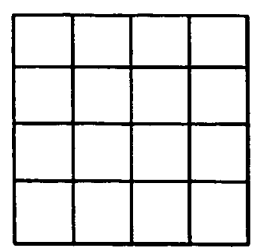
Fig. 2a　　　Fig. 2b　　　Fig. 2c
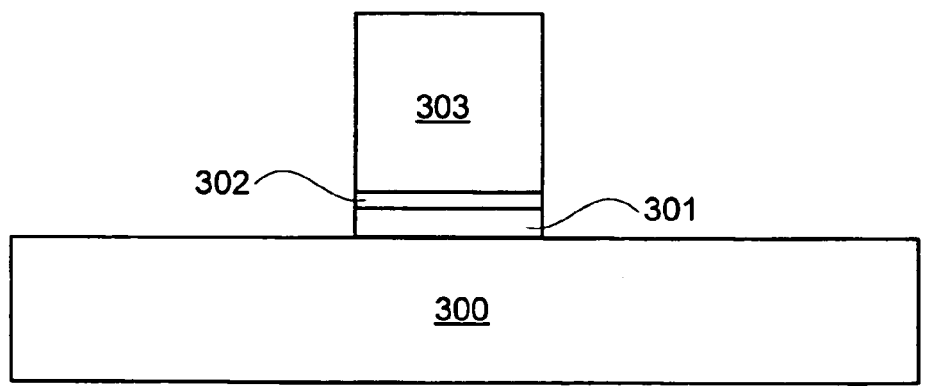
Fig. 3

SEMICONDUCTOR DEVICE WITH A HIGH-K GATE DIELECTRIC AND A METAL GATE ELECTRODE

CLAIM OF PRIORITY

This application is a divisional of U.S. patent application Ser. No. 11/151,528 (now U.S. Pat. No. 7,449,756), which was filed on Jun. 13, 2005.

FIELD OF THE INVENTION

The present invention relates to semiconductor devices, in particular, those with high-k gate dielectrics and metal gate electrodes.

BACKGROUND OF THE INVENTION

MOS field-effect transistors with very thin silicon dioxide based gate dielectrics may experience unacceptable off-state leakage. Forming the gate dielectric from a certain class of high-k dielectric materials can significantly reduce gate leakage.

BRIEF DESCRIPTION OF THE DRAWINGS

FIG. 1 represents a cross-section of the semiconductor device of the present invention.

FIGS. 2a-2c graphically illustrate substrates that may apply strain to a high-k gate dielectric layer because of a lattice mismatch between the high-k gate dielectric layer and the substrate.

FIG. 3 represents a cross-section of an embodiment of the semiconductor device of the present invention in which a high-k gate dielectric layer is formed on a buffer layer that applies strain to the high-k gate dielectric layer.

Features shown in these figures are not intended to be drawn to scale.

DETAILED DESCRIPTION OF THE PRESENT INVENTION

A semiconductor device is described. That semiconductor device comprises a high-k gate dielectric layer that is formed on a substrate that applies strain to the high-k gate dielectric layer, and a metal gate electrode that is formed on the high-k gate dielectric layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

FIG. 1 represents a cross-section of the semiconductor device of one embodiment of the present invention. In that semiconductor device, high-k gate dielectric layer 101 is formed on substrate 100, and metal gate electrode 102 is formed on high-k gate dielectric layer 101. Substrate 100 applies strain to high-k gate dielectric layer 101. In an embodiment, substrate 100 comprises a material, and high-k gate dielectric layer 101 comprises a material and is formed by a process, which ensures that there is a lattice mismatch between high-k gate dielectric layer 101 and substrate 100. Such a lattice mismatch may introduce strain into the high-k gate dielectric layer.

FIGS. 2a-2c graphically illustrate substrates that may apply strain to a high-k gate dielectric layer because of a lattice mismatch between the high-k gate dielectric layer and the substrate. FIG. 2a represents a high-k gate dielectric made from a crystalline material with a unit cell of a certain size. FIG. 2b represents a substrate made from a crystalline material with a unit cell size that is smaller than the unit cell size of the crystalline material from which the high-k gate dielectric layer is made. Because of its smaller unit cell size, such a substrate may apply a compressive strain to a high-k gate dielectric layer, when such a dielectric layer is formed on the substrate. FIG. 2c represents a substrate made from a crystalline material with a larger unit cell size than the unit cell size of the crystalline material from which the high-k gate dielectric layer is made. Because of its larger unit cell size, such a substrate may apply a tensile strain to the high-k gate dielectric layer.

Thus, depending upon the choice of substrate, a high-k gate dielectric may be grown under compressive or tensile strain. The selected substrate may enable growth of a uniformly strained high-k gate dielectric. LSAT (i.e., $(LaAlO_3)_{0.29} \times SrAl_{0.5}Ta_{0.5}O_3)_{0.71}$) is an example of a substrate material that may apply a compressive strain to certain high-k gate dielectric materials, because of a lattice mismatch between LSAT and the high-k gate dielectric. An example of a substrate material that may apply a tensile strain to certain high-k dielectric materials is $DyScO_3$.

Examples of high-k gate dielectric materials, which may be combined with such substrate materials to ensure a lattice mismatch, include titanates such as strontium titanium oxide, barium titanium oxide, or barium strontium titanium oxide. Reactive molecular beam epitaxy ("MBE") or chemical vapor deposition epitaxy ("CVDE") may be used to grow epitaxial high-k films from such materials. MBE may be preferred for a number of reasons. MBE may enable high quality films with abrupt junctions, controlled thickness and desired composition. MBE's relatively slow growth rates (measured in angstroms per second for many materials) may enable nearly atomically abrupt transitions from one material to another—especially when the MBE equipment allows beams to be shuttered in a fraction of a second.

Another advantage to MBE is its proven ability to form thin titanate films on various substrates. See, e.g., J. H. Haeni et al., "Room-temperature ferroelectricity in strained $SrTiO_3$," Nature 430, 758 (2004); F. Amy et al., "Surface and interface chemical composition of thin epitaxial $SrTiO_3$ and $BaTiO_3$ films: Photoemission investigation," J. Appl. Phys. 96, 1601 (2004); F. Amy et al., "Band offsets at heterojunctions between $SrTiO_3$ and $BaTiO_3$ and Si(100)," J. Appl. Phys. 96, 1635 (2004); and S. A. Chambers et al., "Band discontinuities at epitaxial $SrTiO_3$/Si(001) heterojunctions," Appl. Phys. Lett. 77, 1662 (2000).

The high-k gate dielectric layer 101 may have a k-value higher than about 7.5 in some embodiments. In other embodiments, the high-k dielectric layer 101 may have a k-value higher than about 10. In other embodiments, the high-k dielectric layer 101 may comprise a material such as Al2O3 with a k-value of about 12, or may comprise a material with a higher k-value than that. In other embodiments, the high-k dielectric layer 101 may have a k-value between about 15 and about 25. In yet other embodiments, the high-k dielectric layer 101 may have a k-value even higher, such as 35, 80 or even higher.

Although the lattice mismatch between substrate 100 and high-k gate dielectric layer 101 at 25° C. may be between about −2.5% and about +2.5%, it may be desirable to select materials for substrate 100 and high-k gate dielectric layer 101 that will result in a lattice mismatch at 25° C. of between about −1% and about +1%—to minimize dislocations and defects. The combination of (100) LSAT and epitaxially grown (100) SrTiO$_3$ may, for example, result in a compressive lattice mismatch of about −0.9% at 25° C. The combination of (110) DyScO$_3$ and epitaxially grown (100) SrTiO$_3$ may result in a tensile lattice mismatch of about +1% at 25° C. Although a few examples of materials for forming substrate 100 and high-k gate dielectric layer 101 are mentioned here, other materials may be used instead—as will be apparent to those skilled in the art.

For this embodiment, those skilled in the art will recognize that materials, equipment and process steps may be selected to ensure the desired lattice mismatch between substrate 100 and high-k gate dielectric layer 101. That lattice mismatch may cause substrate 100 to apply the desired strain to high-k gate dielectric layer 101—unaccompanied by an unacceptable level of dislocations and defects. The MBE, CVDE, or other process used to deposit high-k gate dielectric layer 101 on substrate 100 may progress until a layer with the desired thickness is formed. In most applications, the resulting high-k gate dielectric layer may be between about 10 angstroms and about 50 angstroms thick.

After forming high-k gate dielectric layer 101 on substrate 100, metal gate electrode 102 may be formed on high-k gate dielectric layer 101. Metal gate electrode 102 may be formed using conventional metal deposition processes, and may comprise any conductive material from which metal gate electrodes may be derived. Materials that may be used to form n-type metal gate electrodes include: hafnium, zirconium, titanium, tantalum, aluminum, their alloys (e.g., metal carbides that include these elements, i.e., hafnium carbide, zirconium carbide, titanium carbide, tantalum carbide, and aluminum carbide), and aluminides (e.g., an aluminide that comprises hafnium, zirconium, titanium, tantalum, or tungsten). Materials for forming p-type metal gate electrodes include: ruthenium, palladium, platinum, cobalt, nickel, and conductive metal oxides, e.g., ruthenium oxide.

Metal NMOS gate electrodes may have a workfunction that is between about 3.9 eV and about 4.2 eV. Metal PMOS gate electrodes may have a workfunction that is between about 4.9 eV and about 5.2 eV. A metal gate electrode that is formed on high-k gate dielectric layer 101 may consist essentially of a homogeneous metal layer. Alternatively, relatively thin n-type or p-type metal layers (like those listed above) may generate the lower part of the metal gate electrode, with the remainder of the metal gate electrode comprising another metal or metals, e.g., a metal that may be easily polished like tungsten, aluminum, titanium, or titanium nitride. Although a few examples of materials for forming a metal gate electrode are identified here, such a component may be made from many other materials, as will be apparent to those skilled in the art.

FIG. 3 represents a cross-section of an embodiment of the semiconductor device of the present invention in which a high-k gate dielectric layer is formed on a buffer layer that applies strain to the high-k gate dielectric layer. As shown, buffer layer 301 is formed on substrate 300, high-k gate dielectric layer 302 is formed on buffer layer 301, and metal gate electrode 303 is formed on high-k gate dielectric layer 302. Substrate 300 may comprise any material that may provide a foundation upon which a semiconductor device may be built, so long as it is compatible with the material used to form buffer layer 301. Depending upon the composition of buffer layer 301 (and upon the type of device to be made), substrate 300 may comprise silicon, germanium, or a combination of those elements.

In this embodiment, buffer layer 301 and high-k gate dielectric layer 302 comprise materials (and are formed by processes) that ensure there is a lattice mismatch between high-k gate dielectric layer 302 and buffer layer 301. Such a lattice mismatch may, for example, introduce a compressive strain into high-k gate dielectric layer 302. If buffer layer 301 comprises (100) LSAT and high-k gate dielectric layer 302 comprises epitaxially grown (100) SrTiO$_3$, buffer layer 301 may apply such a compressive strain to high-k gate dielectric layer 302.

The compressive strain, which a compressive lattice mismatch applies to high-k gate dielectric layer 302, may meaningfully reduce the dielectric constant of high-k gate dielectric layer 302 in the plane parallel to electron or hole flow. As a result, mobility characteristics may be enhanced, when compared to the mobility properties of a device with an uncompressed high-k gate dielectric layer. Moreover, it is believed that such a compressive lattice mismatch may increase the dielectric constant parallel to the vertical electric field at the same time it decreases the in-plane dielectric constant. For that reason, the semiconductor device of the present invention may demonstrate relatively low off-state leakage—because of the relatively high capacitance in the vertical direction—while simultaneously improving on-state mobility—because of the reduced in-plane dielectric constant.

When making a CMOS device with the FIG. 3 structure for both NMOS and PMOS devices, different materials and process steps may be used to form the buffer layers and the gate dielectrics for the NMOS and PMOS devices. Alternatively, it may be possible to use the same materials for buffer layer 301 and for high-k gate dielectric layer 302 for both NMOS and PMOS devices.

Although the example set forth above illustrates how a compressive lattice mismatch may enhance off-state leakage and on-state mobility characteristics, the present invention contemplates other structures in which a tensile lattice mismatch between a substrate and an epitaxially grown high-k gate dielectric layer improve both leakage and mobility characteristics.

Additionally, while the examples set forth above are primarily concerned with NMOS and PMOS devices, strained high-k dielectric layers may be used in other types of devices as well. For example, a silicon on insulator (SOI) or other type of device may be made with mid-gap gate electrode materials, rather than NMOS or PMOS gate electrode materials. Such mid-gap gate electrode devices may include a strained high-k dielectric layer. In some embodiments, the material of the mid-gap gate electrode may have a workfunction between the workfunctions of NMOS and PMOS gate electrode materials. The mid-gap gate electrode may comprise titanium nitride, tantalum nitride, tantalum, or another appropriate material.

Thus, although the foregoing description has specified some embodiments of the semiconductor device of the present invention, those skilled in the art will appreciate that many modifications and substitutions may be made. All such modifications, substitutions and additions fall within the spirit and scope of the invention as defined by the appended claims.

What is claimed is:

1. A semiconductor device comprising:
   a buffer layer that is formed on a substrate, the buffer layer comprising LSAT;
   a high-k gate dielectric layer that is formed on the buffer layer, the high-k gate dielectric layer comprising SrTiO$_3$; and
   a metal gate electrode that is formed on the high-k gate dielectric layer;
   wherein the buffer layer applies compressive strain to the high-k gate dielectric layer.

2. The semiconductor device of claim 1 wherein the high-k gate dielectric layer is between about 10 angstroms and about 50 angstroms thick, is formed using molecular beam epitaxy, and is selected from the group consisting of strontium titanium oxide, barium titanium oxide, and barium strontium titanium oxide.

3. The semiconductor device of claim 1 wherein the metal gate electrode is an NMOS metal gate electrode.

4. The semiconductor device of claim 3 wherein the NMOS metal gate electrode comprises a material that is selected from the group consisting of hafnium, zirconium, titanium, tantalum, aluminum, a metal carbide, and an aluminide, and the strain applied to the high-k gate dielectric layer results from a lattice mismatch between the high-k gate dielectric layer and the buffer layer.

5. The semiconductor device of claim 1 wherein the strain applied to the high-k gate dielectric layer results from a lattice mismatch between the high-k gate dielectric layer and the buffer layer.

6. The semiconductor device of claim 5 wherein the lattice mismatch at 25° C. is between about −2.5% and about +2.5%.

7. The semiconductor device of claim 6 wherein the lattice mismatch at 25° C. is between about −1% and about +1%.

8. The semiconductor device of claim 7 wherein the substrate comprises LSAT and the lattice mismatch at 25° C. is about −0.9%.

9. The semiconductor device of claim 1 wherein the metal gate electrode is a PMOS metal gate electrode.

10. The semiconductor device of claim 9 wherein the PMOS metal gate electrode comprises a material that is selected from the group consisting of ruthenium, palladium, platinum, cobalt, nickel, and a conductive metal oxide.

11. The semiconductor device of claim 1 wherein the metal gate electrode is a mid-gap metal gate electrode.

12. The semiconductor device of claim 11 wherein the mid-gap metal gate electrode comprises a mid gap material that is selected from the group consisting of titanium nitride, tantalum nitride, and tantalum.

* * * * *